United States Patent [19]

Ebihara

[11] 4,164,842
[45] Aug. 21, 1979

[54] BUFFER AMPLIFIER CIRCUIT

[75] Inventor: Heihachiro Ebihara, Tokorozawa, Japan

[73] Assignee: Citizen Watch Co., Ltd., Tokyo, Japan

[21] Appl. No.: 824,603

[22] Filed: Aug. 15, 1977

[30] Foreign Application Priority Data

Aug. 20, 1976 [JP] Japan .................................. 51-99419

[51] Int. Cl.² .......................... G04C 3/00; H03K 19/08
[52] U.S. Cl. .................................. 58/23 A; 58/23 D; 307/205; 307/270
[58] Field of Search .................. 58/23 R, 23 A, 23 D; 307/205, 270

[56] References Cited

U.S. PATENT DOCUMENTS

| 3,812,670 | 5/1974 | Nikaido et al. | 58/23 R |
| 3,937,003 | 2/1976 | Busch et al. | 58/23 D |
| 3,939,644 | 2/1976 | Wolf | 58/23 R |

Primary Examiner—Stanley J. Witkowski
Attorney, Agent, or Firm—Sherman & Shalloway

[57] ABSTRACT

A buffer amplifier circuit comprising complementary MOS transistors and used as a load driving circuit for effecting ON and OFF of a relatively large current flowing through a small electronic device such as a crystal time piece and the like. The circuit comprises a wave form shaping circuit for applying signals to the complementary MOS transistors said signals being different from each other on the basis of input signals to the shaping circuit, thereby preventing both the transistors from becoming ON at the same time.

8 Claims, 8 Drawing Figures

BUFFER AMPLIFIER CIRCUIT

BACKGROUND OF THE INVENTION

1. Field of the Invention

This invention relates to buffer amplifier circuits and more particularly to a buffer amplifier circuit used as a load driving circuit for effecting ON and OFF of a relatively large current flowing through a small electronic device such as a crystal timepiece and the like.

2. Description of the Prior Art

A load driving circuit for a small electronic device driven by a battery has heretofore been frequently composed of complementary MOS transistors for the purpose of decreasing consumption of the battery. Such MOS transistor usually constituting a logic part of the circuit has a width and length on the order of approximately 10$\mu$, respectively. An ON resistance of such size of MOS transistor becomes large such as 50 K$\Omega$ to 100 K$\Omega$. As a result, when a relatively large current must be made ON and OFF by only one part of the device, as a buffer amplifier use is made of a MOS transistor having a particularly large channel width by taking the above mentioned large resistance value into consideration.

However, if an input voltage applied to the complementary MOS transistors becomes substantially one-half an electric source voltage, both P channel MOS transistor and N channel MOS transistor become ON at the same time, thus flowing a so-called threading current therethrough. In the above mentioned buffer amplifier circuit, this threading current becomes so large that a consumed electric current is significantly increased.

SUMMARY OF THE INVENTION

A main object of the invention, therefore, is to provide a novel buffer amplifier circuit which can decrease a threading current flowing through a buffer amplifier so as to make an electric source battery used for an electronic device long in life.

A feature of the invention is the provision of a buffer amplifier circuit comprising an electric source, a P channel MOS transistor having a source connected to a high potential side of the electric source, an N channel MOS transistor having a source connected to a low potential side of the electric source, drains of both the transistors being connected in common and constituting an output end of the circuit, and a wave form shaping circuit for applying signals to both the transistors, the signals being different from each other on the basis of input signals to the shaping circuit, whereby the N channel MOS transistor becomes OFF prior to a time at which the P channel MOS transistor becomes ON and the P channel MOS transistor becomes OFF prior to a time at which the N channel MOS transistor becomes ON thus preventing both the transistors from becoming ON at the same time.

The invention will now be described in greater detail with reference to the accompanying drawings.

PREFERRED EMBODIMENTS OF THE INVENTION

Figure 1A:
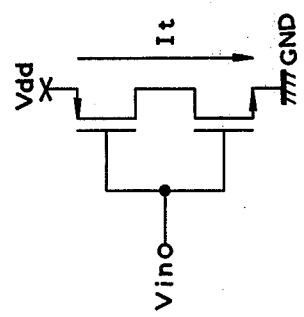
FIG. 1A is a circuit diagram showing a complementary MOS inverter circuit.
Figure 1B:
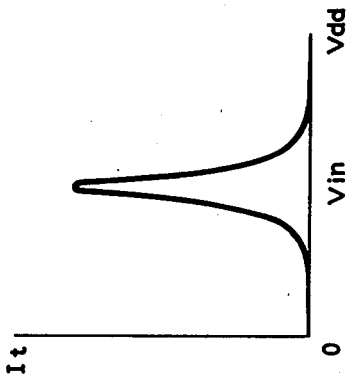
FIG. 1B is a graph showing a curve of an input voltage as a function of a threading current flowing through the circuit shown in FIG. 1A.

In FIG. 1A is shown a complementary MOS inverter and in FIG. 1B is shown a relation between a threading current flowing through the inverter shown in FIG. 1A and its input voltage. As shown in FIGS. 1A and 1B, when an input voltage Vin becomes near substantially one-half an electric source voltage Vdd, a large threading current flows through the inverter.

Figure 2A:
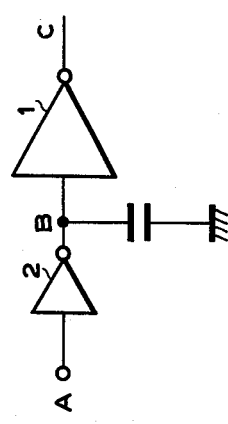
FIG. 2A is a circuit diagram showing a conventional buffer amplifier circuit.
Figure 2B:
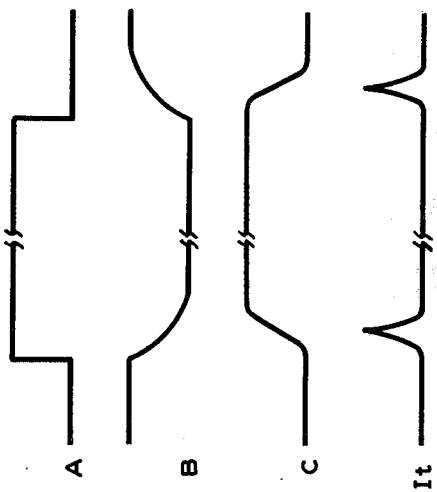
FIG. 2B is a diagram showing various wave forms at different parts of the circuit shown in FIG. 2A.

In FIG. 2A is shown a logic gate 2 and a buffer amplifier 1 connected in an usual manner. In the buffer amplifier 1 having a capacity of 50 PF to 100 PF, for example, even if a signal whose rising up time and falling down time are sharp is applied to an input end A of the gate 2, a signal delivered from an output end B thereof has a slowly rising and falling wave form as shown in FIG. 2B and a large time constant of 2 to 10 $\mu$s. As a result, at intervals of time at which the potential at the output end B is slowly changed, a threading current It such as shown in FIG. 2B flows through the buffer amplifier 1 thus consuming a useless electric power and making a battery short in life.

In order to eliminate such a drawback, if the rising up time and falling down time of an input signal of the buffer amplifier 1 at the output end B of the gate 2 are made rapid, an output impedance of the gate 2 must be decreased in the end. As a result, it is obliged to make a channel width of a MOS transistor constituting the logic gate 2 considerably large, thereby increasing a capacity at the input of the logic gate 2. Accordingly, there is a risk of the logic gate 2 per se being flown through by the threading current. Thus, it is not advisable to make the output impedance of the logic gate 2 extremely small in view of the consumed electric power.

Attempts have been made to connect to a conventional logic gate several stages of inverters whose conductances are gradually increased for the purpose of driving a buffer amplifier. In such system, it is evident that successive inverters inserted between the conventional logic gate and the buffer amplifier must have conductances which are increased about two times one by one for the purpose of obtaining the least threading current flowing all of these inverters. Since the conductance of the inverter is proportional to its area, in order to satisfy the above mentioned condition, the total area of all of the inverters is given by $$S(1+\tfrac{1}{2}+\tfrac{1}{4}\ldots)\approx 2S$$

where S is an area of the buffer amplifier.

As seen from the above equation, the total area of all of the inverters is about two times larger than the area of the buffer amplifier. The use of such converters, therefore, is not practical. As a result, in the existing prior art technique, use has been made of a limited number of converter stages thus permitting a more or less increase of the threading current.

Figure 3A:
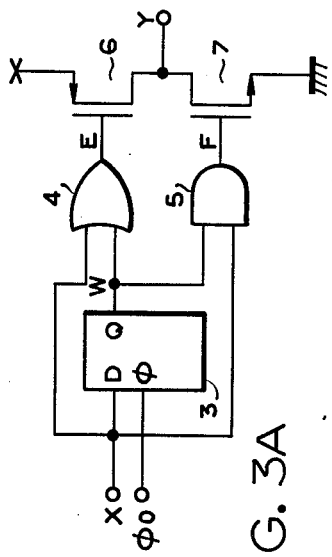
FIG. 3A is a buffer amplifier circuit according to the invention.

In FIG. 3A is shown one embodiment of a buffer amplifier circuit according to the invention. In the present embodiment, provision is made of a data type flipflop 3 having a clock input end $\phi$ and a data input end D. A clock signal $\phi_o$ is applied to the clock input end $\phi$ and a driving signal x is applied to the data input end D and to one of input terminals of a two inputs OR gate 4 and one of input terminals of a two inputs AND gate 5. The remaining input terminals of these two gates 4,5 are connected in common to an output end Q of the flipflop 3 to receive a signal W. An output E from the OR gate 4 is connected to a gate of a P channel MOS transistor 6 and an output F of the AND gate 5 is connected to a gate of N channel MOS transistor 7. A source of the MOS transistor 6 is connected to a high potential side (hereinafter will be abbreviated as "H") of an electric source and a drain of the MOS transistor 6 is connected in common to a drain of the N channel MOS transistor 7 so as to constitute an output end. A source of the MOS transistor 7 is connected to a low potential side (hereinafter will be abbreviated as "L") of the electric source.

Figure 3B:
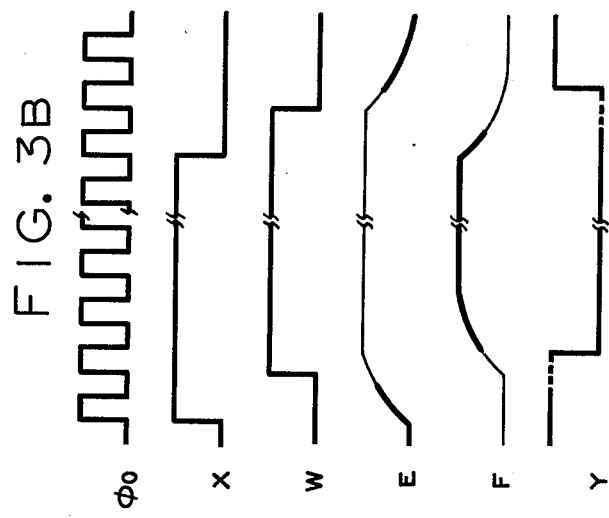
FIG. 3B is a diagram showing various wave forms at different parts of the circuit shown in FIG. 3A.

In FIG. 3B are shown various wave forms at different parts of the circuit shown in FIG. 3A. If the driving signal x is changed from "L" to "H", E rises up from "L" to "H". The MOS transistor 6 is ON condition until E passes near one-half the electric source voltage where W is still "L". As a result, F is "L", so that the MOS transistor 7 is OFF condition. If the potential E becomes higher than one-half the electric source voltage and the clock pulse $\phi_o$ is changed from "L" to "H", the flipflop 3 reads out the value of x and hence W is changed from "L" to "H". As a result, the MOS transistor 7 becomes ON. Since then the MOS transistor 6 remains under its OFF condition and the MOS transistor 7 remains under its ON condition until x becomes "L". If x is changed from "H" to "L", F is immediately changed from "H" to "L" to make the MOS transistor 7 OFF. Subsequently, if the clock pulse $\phi_o$ is rised up, the flipflop 3 is triggered to change W from "H" to "L". As a result, E falls down from "H" to "L" to make the MOS transistor 6 ON again. As seen from the above, both the MOS transistors 6 and 7 are prevented from becoming ON at the same time. Thus, it is possible to completely eliminate the useless threading current.

In the above embodiment, both the gates of the transistors 6 and 7 become high potential when the potential of the input data is high. Alternatively, the circuit shown in FIG. 3A may be constructed such that both the gates of the transistors 6 and 7 become high potential when the potential of the input data is low. In such case, the input ends of the OR gate 4 and AND gate 5 are required to have inversion ability which corresponds to that of a NAND gate and NOR gate, respectively. In the present invention, it should be understood that the NAND gate means a gate having OR ability and the NOR gate means a gate having AND ability.

Figure 4A:
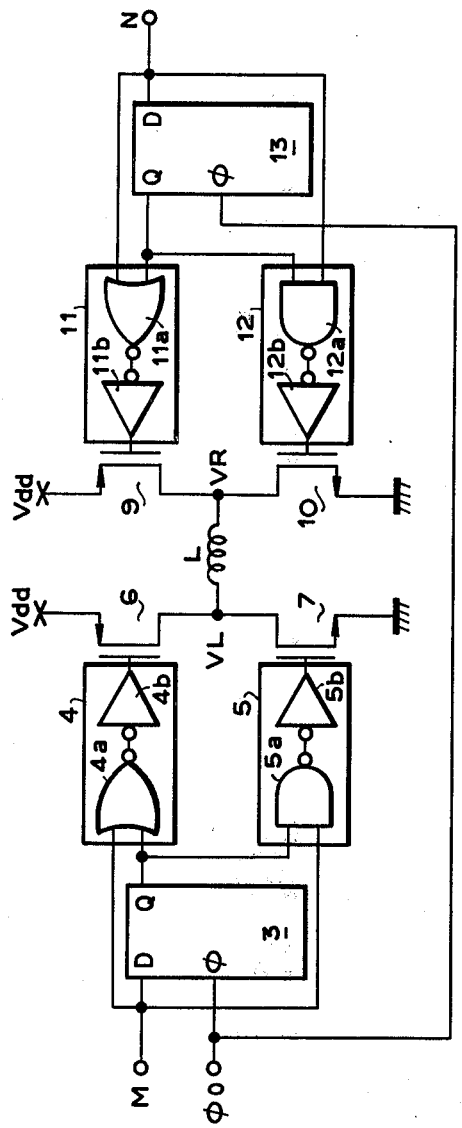
FIG. 4A is a circuit diagram of one embodiment of the buffer amplifier circuit according to the invention used as a timepiece circuit.
Figure 4B:
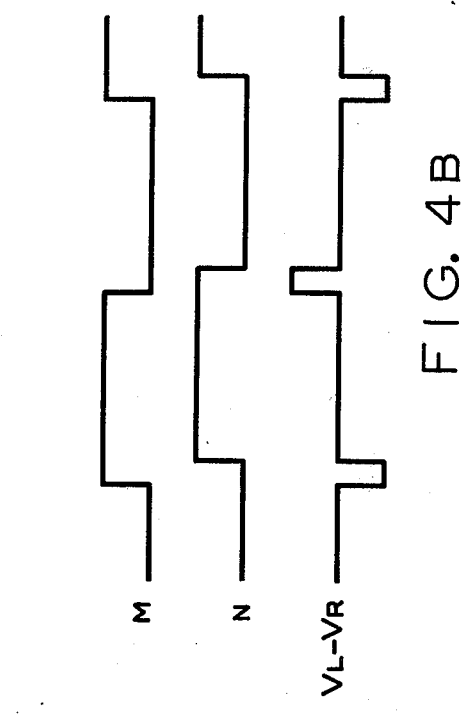
FIG. 4B is a diagram showing various wave forms at different parts of the circuit shown in FIG. 4A.

In FIG. 4A is shown another embodiment of a buffer amplifier circuit according to the invention which is used as a timepiece circuit for driving a stepping motor and in FIG. 4B are shown various wave forms at different parts of the circuit shown in FIG. 4A. In the present embodiment, the threading current is prevented from becoming flown at the instance of changing $V_L$-$V_R$.

A circuit shown in FIG. 4A is composed of a data type flipflop 3, an OR gate 4 consisting of a NOR gate 4a and an inverter 4b, an AND gate 5 consisting of a NAND gate 5a and an inverter 5b and transistors 6 and 7 is the same in construction as that of the circuit shown in FIG. 3A. Another circuit shown in FIG. 4A composed of a data type flipflop 13, an OR gate 11 consisting of a NOR gate 11a and a inverter 11b, an AND gate 12 consisting of a NAND gate 12a and an inverter 12b and transistors 9 and 10 is also the same in construction as that of the circuit shown in FIG. 3A. As shown in FIG. 4B, if a data input M to the flipflop 3 becomes "H", the operation described with reference to FIG. 3B is effected in synchronism with a clock pulse $\phi_o$. That is, at first the transistor 6 becomes OFF and then the transistor 7 becomes ON. At this instance, the transistor 9 is ON and the transistor 10 is OFF. As a result, a current flows a coil L for driving the stepping motor in a direction from right to left. If a data input N to the flipflop 13 becomes "H", at first the transistor 9 becomes OFF to cut off the current flowing through the coil L. Then, the transistor 10 becomes ON to shortcircuit the both ends of the coil L. As seen from the above, it is possible to prevent the both the transistors 6 and 7 or both the transistors 9 and 10 from becoming ON at the same time and eliminate the threading current.

Similarly, a current can flow the coil L in a direction from left to right in FIG. 4A.

What is claimed is:

1. A buffer amplifier circuit comprising an electric power source having a high potential side and a low potential side, a P-channel MOS transistor having a gate, a drain and a source, said P-channel source connected to a high potential side of said electric power source, an N-channel MOS transistor having a gate, a drain and a source, said N-channel source connected to a low potential side of said electric power source, said drains of both said transistors being connected in common and constituting an output of said circuit, and a wave form shaping circuit comprising a data-type flipflop having a data input, a clock input and an output, first gate means having a first input connected to said data input, a second input and an output connected to the gate of said P-channel MOS transistor, and second gate means having a first input connected to said data input and a second input, and an output connected to the gate of said N-channel MOS transistor, the second input of said first gate means and the second input of said second gate means being connected in common to said output of said flipflop, said flipflop being operated to change the level at said output thereof when supplied with each pulse of a clock signal at said clock input whereby said N-channel MOS transistor becomes OFF prior to a time at which said P-channel MOS transistor becomes ON and said P-channel MOS transistor becomes OFF prior to a time at which said N-channel MOS transistor becomes ON thus preventing both said transistors from becoming ON at the same time and eliminating any threading currents.

2. The buffer amplifier circuit according to claim 1 wherein said first gate means is an OR-gate and said second gate means is an AND-gate.

3. The buffer amplifier circuit according to claim 2 wherein said OR-gate is a NOR-gate in series with an inverter and said AND-gate is a NAND-gate in series with a second inverter.

4. The buffer amplifier circuit according to claim 1 wherein said output of said circuit is connected to a timepiece stepping motor coil.

5. The buffer amplifier circuit according to claim 1 further comprising a second P-channel MOS transistor having a gate, a drain and a source, said second P-channel source connected to the high potential side of said electric power source, a second N-channel MOS transistor having a gate, a drain and a source, said N-channel source connected to the low potential side of said electric power source, said second P-channel drain and said second N-channel drain being connected in common and constituting a second output of said circuit, a second wave form shaping circuit for applying signals to both said second transistors and a timepiece stepping motor coil having a first end connected to the output of the circuit and a second end connected to the second output of said circuit.

6. The buffer amplifier circuit of claim 5 wherein said wave form shaping circuit comprises a second data-type flipflop having a second data input, a second clock input and a second output, third gate means having a first input connected to said second data input, a second input and an output connected to the gate of said second P-channel MOS transistor, and fourth gate means having a first input connected to said second data input, a second input and a second output connected to the gate of said second N-channel MOS transistor, the second inputs of said third and fourth gate means being connected in common to said second output of said second flipflop, said second flipflop being operated to change the level of said second output thereof when supplied with each pulse of the clock signal at said second clock pulse input whereby said second N-channel MOS transistor becomes OFF prior to a time at which said second P-channel MOS transistor become ON and said second P-channel MOS transistor becomes OFF prior to a time at which said second N-channel MOS transistor becomes ON thus preventing both said second transistors from becoming ON at the same time and eliminating any threading currents.

7. The buffer amplifier circuit of claim 6 wherein said third gate means is a second OR-gate and said fourth gate means is a second AND-gate.

8. The buffer amplifier circuit according to claim 7 wherein said second OR-gate is a second NOR-gate in series with a third inverter and said second AND-gate is a second NAND-gate in series with a fourth inverter.

* * * * *